(12) United States Patent
Hayden et al.

(10) Patent No.: US 6,515,736 B1
(45) Date of Patent: Feb. 4, 2003

(54) RETICLE CAPTURING AND HANDLING SYSTEM

(75) Inventors: Dennis M. Hayden, Essex Junction, VT (US); Timothy E. Neary, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/564,189

(22) Filed: May 4, 2000

(51) Int. Cl.[7] .......................... G03B 27/62; B65H 1/00; G03C 5/00; G01J 1/00; B41M 1/12

(52) U.S. Cl. ............................ 355/75; 355/76; 355/77; 414/226.01; 414/416.01; 414/217; 430/311; 250/491.1; 101/129

(58) Field of Search .............................. 355/75, 76, 77; 414/226.01, 416.01, 217; 430/311; 250/491.1; 101/129

(56) References Cited

U.S. PATENT DOCUMENTS

| | | | |
|---|---|---|---|
| 4,544,311 A | * | 10/1985 | Husain |
| 4,549,843 A | | 10/1985 | Jagusch et al. |
| 5,023,659 A | | 6/1991 | Beasley |
| 5,026,239 A | * | 6/1991 | Chiba et al. |
| 5,164,974 A | * | 11/1992 | Kariya et al. |
| 5,902,705 A | * | 5/1999 | Okamoto et al. |
| 6,142,722 A | * | 11/2000 | Genov et al. |
| 6,211,945 B1 | * | 4/2001 | Baxter et al. |

FOREIGN PATENT DOCUMENTS

JP     09232402     9/1997

OTHER PUBLICATIONS

IBM Technical Disclosure Bulletin, "Robotic Mask Pellicle Placement System for a Class 10 Clean Room Environment", Dec., 1991, pp. 205–207.
IBM Technical Disclosure Bulletin, "Robotic Mask/Pellicle End of Arm Tooling Mechanism", Sep., 1991, pp. 395–396.
IBM Technical Disclosure Bulletin, "Mask Handling Tool", Jul., 1990, p. 45.
IBM Technical Disclosure Bulletin, "Handling Tool for Masks and Wafers", Jan., 1998, pp. 386–387.
IBM Technical Disclosure Bulletin, "Mask/Reticle Frame", Aug., 1985, p. 1368.
IBM Technical Disclosure Bulletin, "Gripper Assembly for a Robot", Jun., 1984, pp. 388–390.
IBM Technical Disclosure Bulletin, "Mask Alignment Technique", Nov., 1980, pp. 2284–2286.
IBM Technical Disclosure Bulletin, "Mask Load Unload Device", pp. 2067–2068.

* cited by examiner

*Primary Examiner*—Russell Adams
*Assistant Examiner*—Khaled Brown
(74) *Attorney, Agent, or Firm*—Schmeiser, Olsen & Watts (57) ABSTRACT

A reticle capturing system includes a reticle that defines a first recess extending into the reticle from a first edge of the reticle and a second recess extending into the reticle from a second edge of the reticle. The reticle capturing system also includes a first finger selectively extending into the first recess and a second finger selectively extending into the second recess. The first and second fingers may be tapered so that the reticle capturing system will be self centering. The reticle capturing system may also include a third recess defined by the reticle and a third finger selectively extending into a recess. A method for capturing a reticle includes providing a reticle that defines a recess at an edge of the reticle and inserting the finger into the recess. The method may further include inserting a second finger into a second recess.

18 Claims, 14 Drawing Sheets

RETICLE CAPTURING AND HANDLING SYSTEM

BACKGROUND OF THE INVENTION

1. Technical Field

This invention relates to the field of reticles. More specifically, the invention relates to reticle capturing and handling.

2. Background Art

Reticles or masks are employed in lithographic systems for fabricating circuits in semiconductor wafers or other substrates. Typically, a pellicle that is parallel to the reticle is secured to the reticle by a pellicle frame near the edge of the reticle. The combined pellicle and reticle apparatus or the reticle alone must be moved within the clean room environment. Accordingly, the reticle must be captured and moved manually or by an automated handling system.

Prior manual and automated handling systems have required contact with the bottom and/or top surface of the reticle, have interfered with the pellicle or pellicle frame, or have been unreliable and susceptible to dropping the reticle. Some handling systems have only been useful for a particular size of reticle, and some have not provided sufficient cleanliness for a clean room environment.

DISCLOSURE OF INVENTION

The present invention provides a novel reticle design, a novel reticle capturing system, and a novel method of capturing a reticle that overcome the problems described above. According to the present invention, a reticle includes a substrate defining a recess that extends into the substrate from an edge thereof. In one embodiment, the substrate defines a first recess and an opposing second recess, and the substrate may define more than two such recesses.

The invention also includes a reticle capturing system that includes a reticle. In an embodiment, the reticle defines a first recess extending into the reticle from a first edge of the reticle and a second recess extending into the reticle from a second edge of the reticle. The reticle capturing system also includes a first finger selectively extending into the first recess and a second finger selectively extending into the second recess. The first and second fingers may be tapered so that the reticle capturing system will be self centering. The reticle capturing system may also include a third recess defined by the reticle and a third finger selectively extending into a recess.

The invention also includes a method for capturing a reticle that includes providing a reticle that defines a recess extending into the reticle from an edge thereof, and inserting the finger into the recess. The method may further include inserting a second finger into a second recess.

The present invention provides many advantages. First, there is no need to touch the top surface or the bottom main surface of the reticle so there is virtually no risk of damaging the pattern formed on the reticle, and the reticle capturing system may be used for virtually any type or shape of pellicle or pellicle frame. Second, the mating of recesses with fingers holds the reticle securely with little risk of it being dropped, even for heavy reticles such as 9 inch reticles. Third, because the recesses extend inwardly from the periphery of the reticle, the area of the reticle that is transparent and can be effectively used is not diminished. Fourth, the tapered recesses and tapered fingers are self-centering so that the fingers need only be substantially aligned before being inserted into corresponding tapered recesses; once the fingers are fully extended into the recesses, the reticle is precisely positioned within the reticle capturing system. The present invention is particularly useful for automated handling of reticles, but it also provides beneficial results if it is used as a manual reticle handler.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements.

BEST MODES FOR CARRYING OUT THE INVENTION

Figure 1:
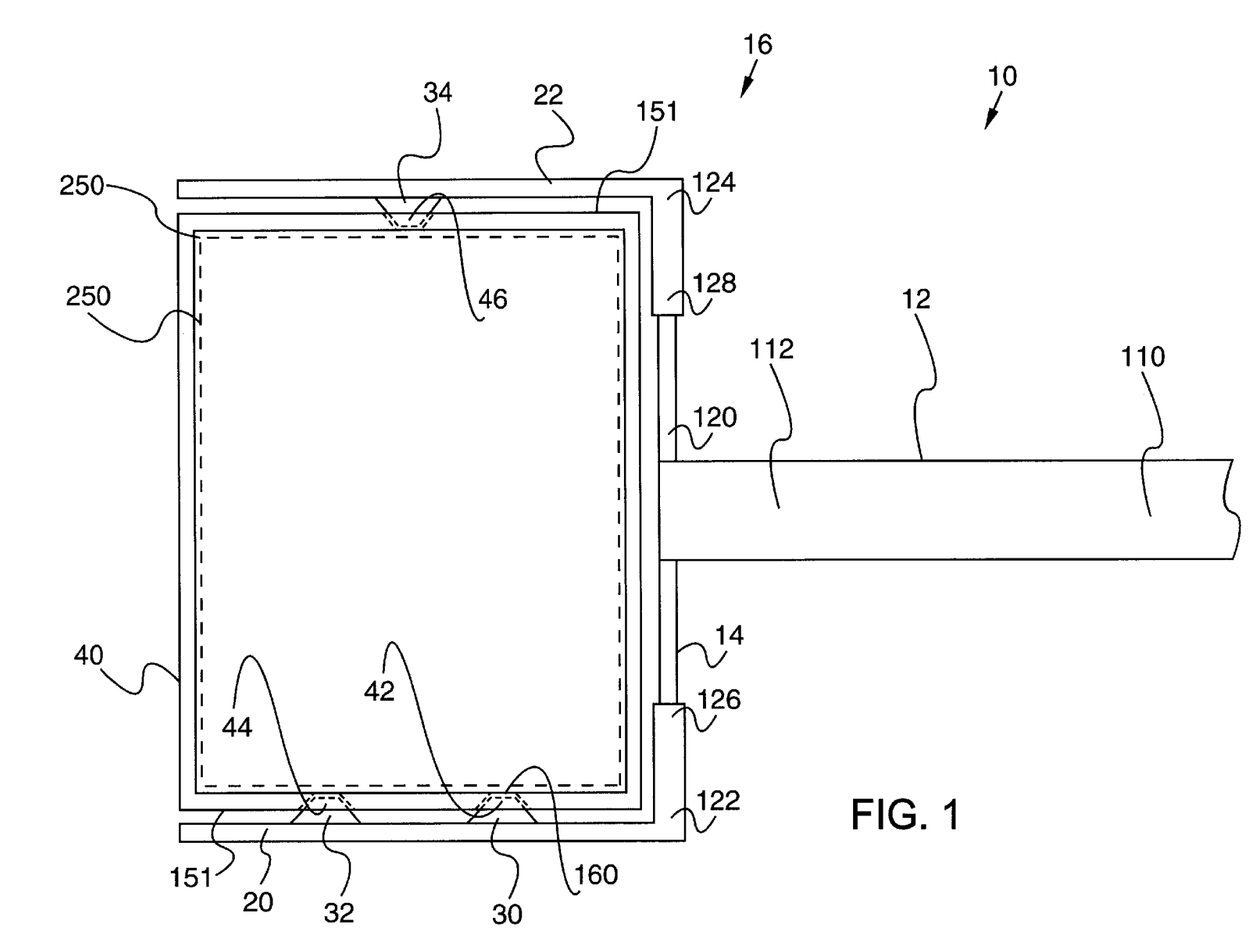
FIG. 1 is top plan view of a reticle capturing system according to a preferred embodiment of the present invention.
Figure 2:
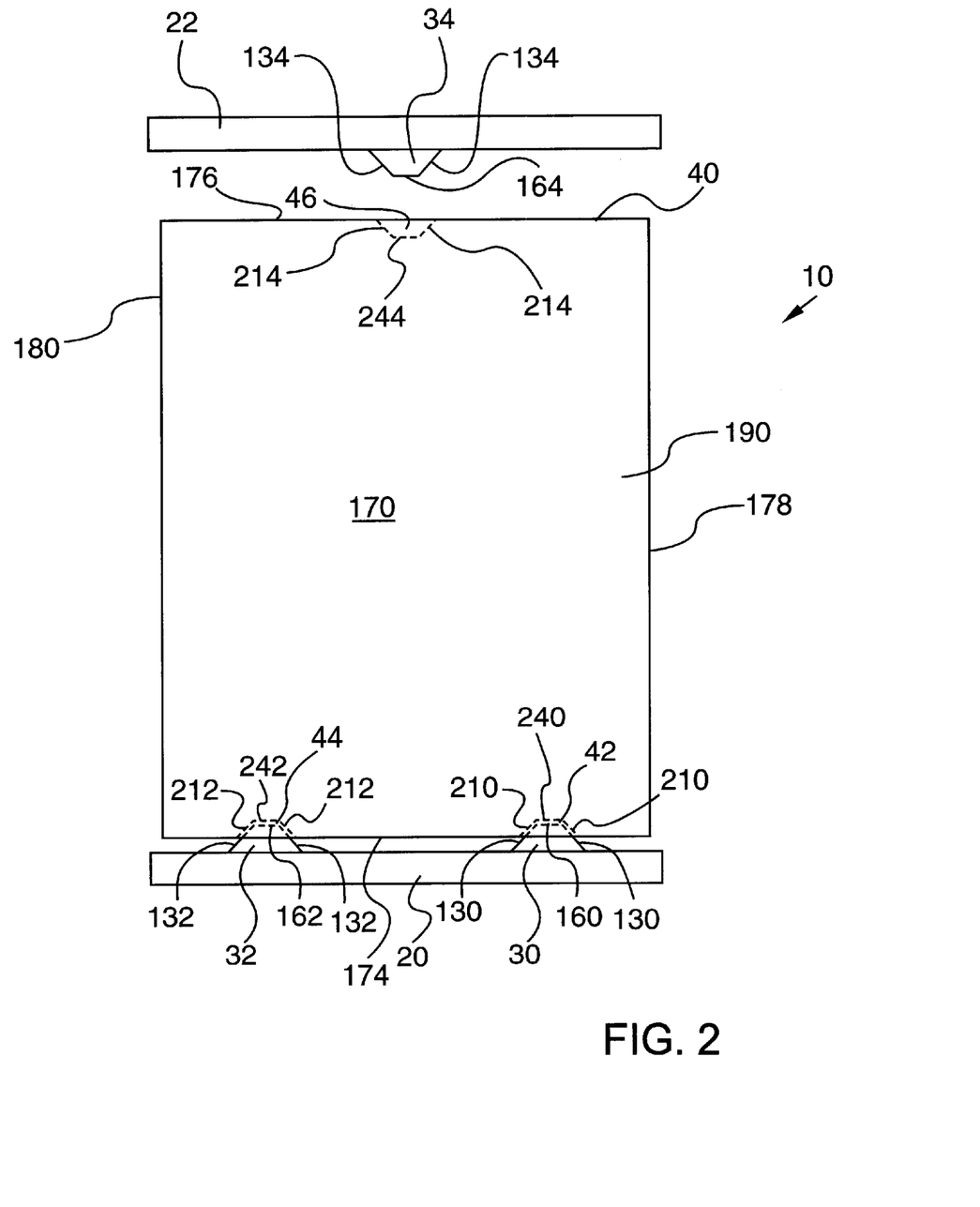
FIG. 2 is a top plan view of a portion of the reticle capturing system of FIG. 1.
Figure 3:
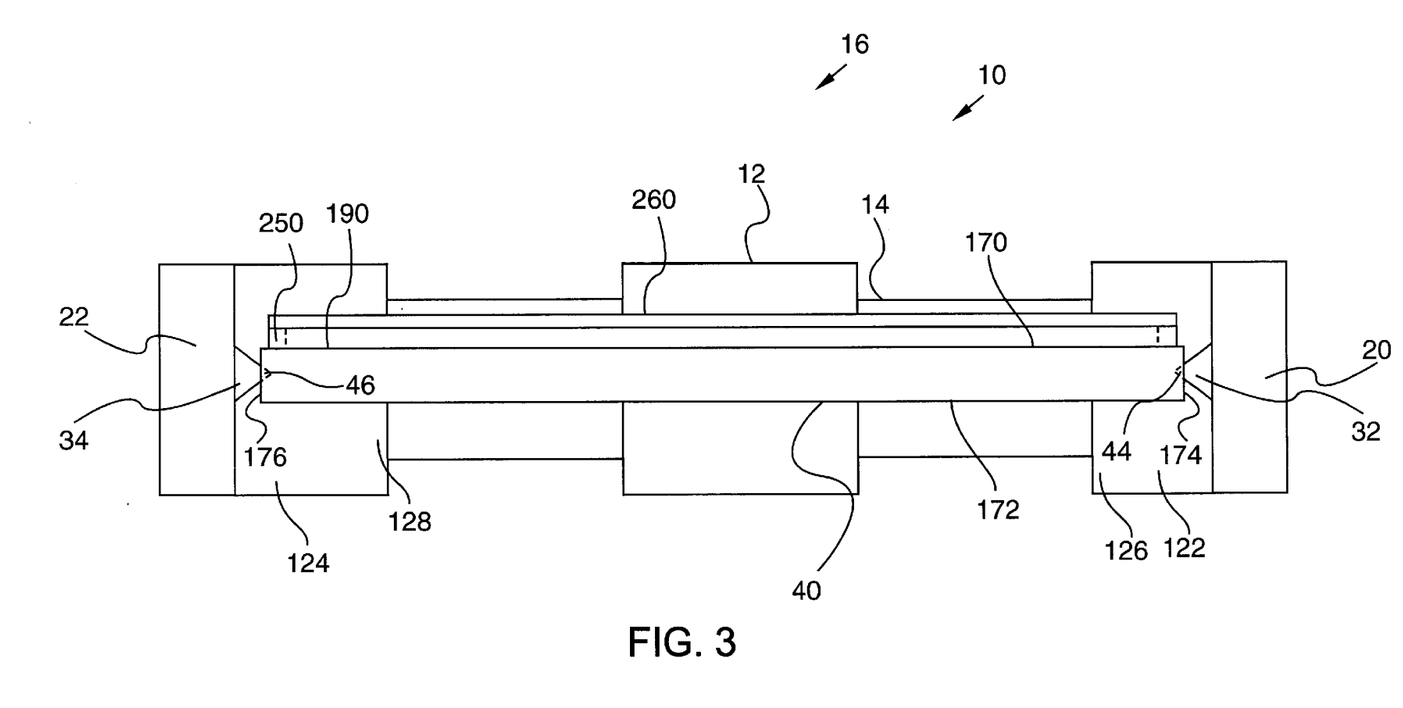
FIG. 3 is a front plan view of the reticle capturing system of FIG. 1.
Figure 4:
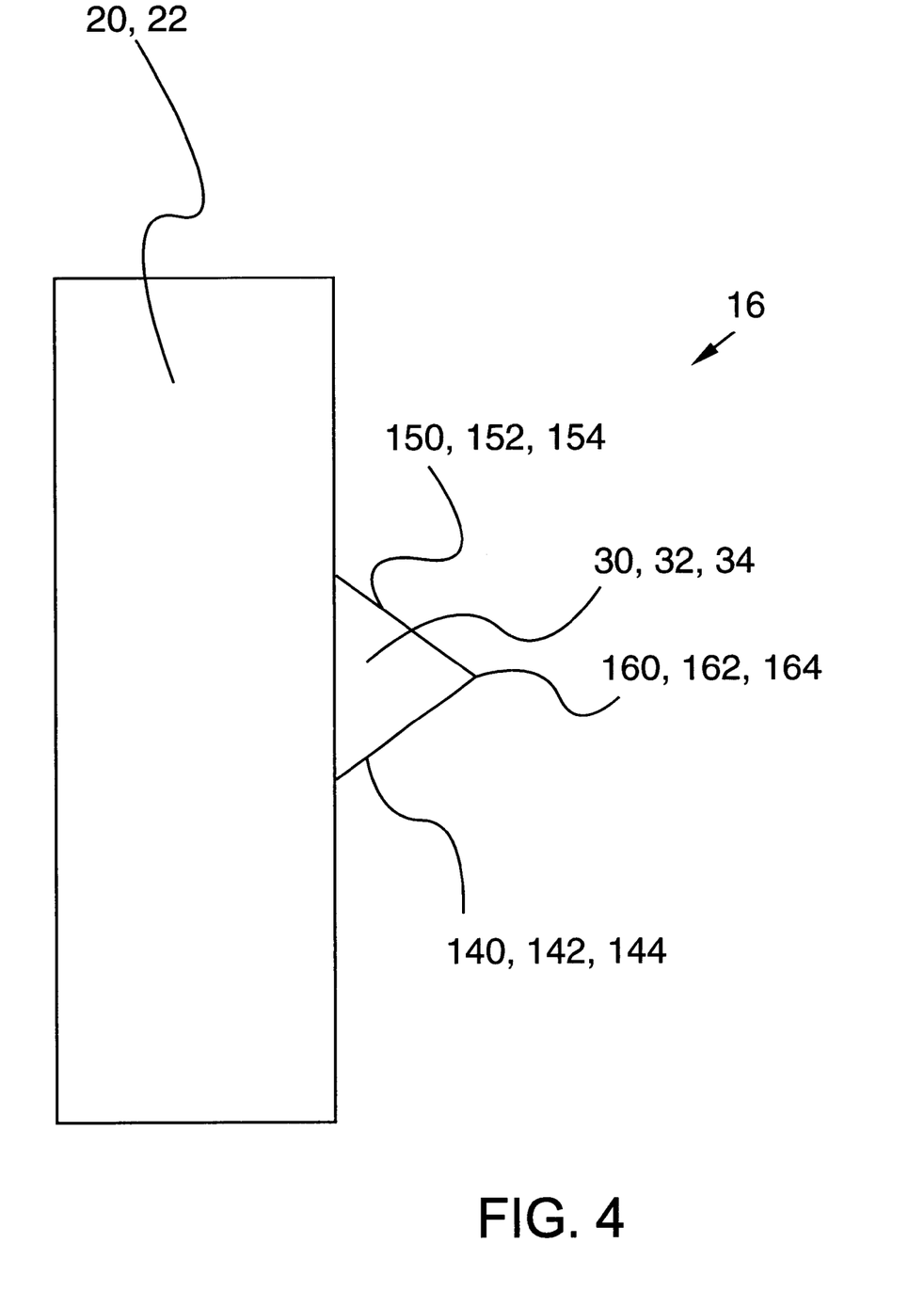
FIG. 4 is a front or rear plan view of an arm and finger of the reticle capturing system of FIG. 1.
Figure 5:
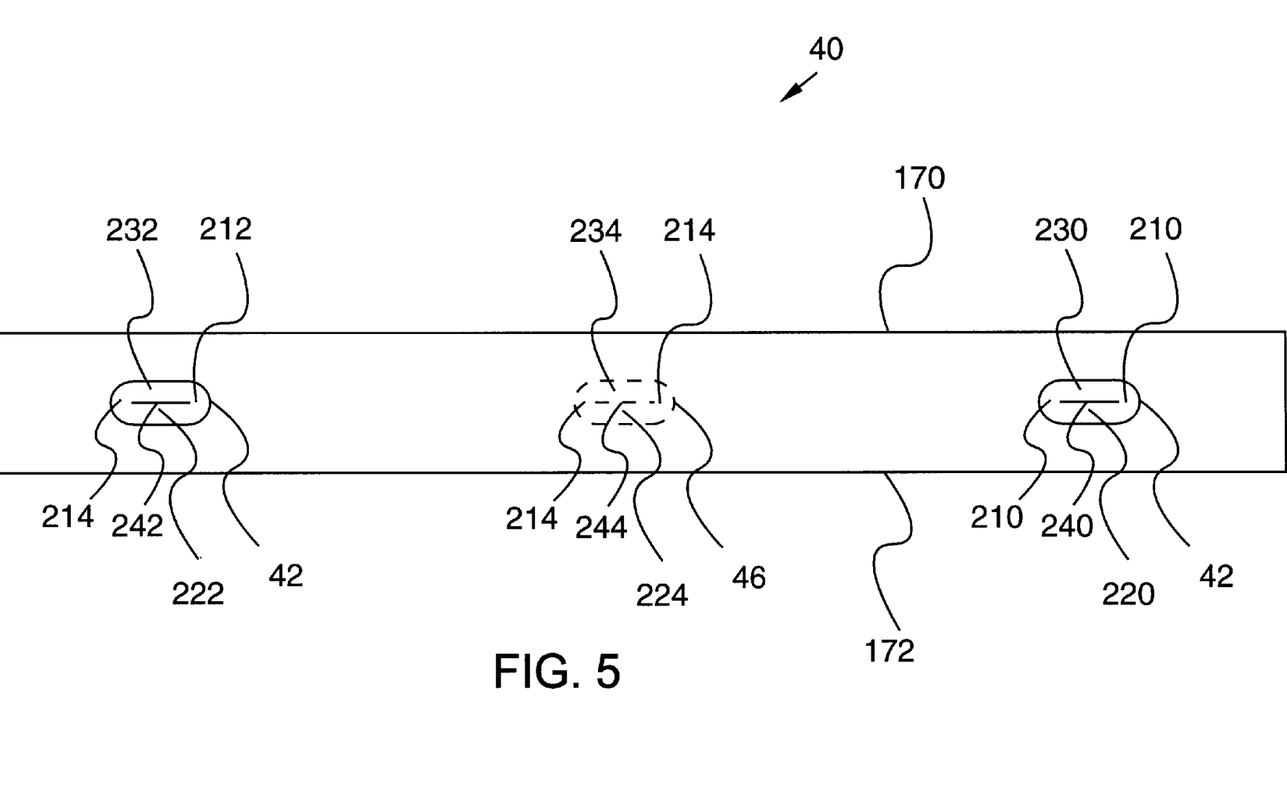
FIG. 5 is a side plan view of the reticle of the reticle capturing system of FIG. 1.

Referring now to FIG. 1, capturing system 10 includes a handle 12 connected to an end effector or pick 16 (referred to as an end effector for an automated system and a pick for a manual system). End effector or pick 16 includes a bracket 14, capturing arms 20, 22 that extend from opposing ends of bracket 14, and fingers 30, 32, 34 that extend from capturing arms 20, 22. A first finger 30 and a third finger 32 are attached to first arm 20 and extend toward second arm 22. A second finger 34 is attached to second arm 22 and extends toward first arm 20.

Capturing system 10 also includes a reticle or substrate 40 that defines a first recess 42, a third recess 44 and a second recess 46. Reticle 40 is captured by moving first arm 20 and second arm 22 toward each other and thereby inserting first finger 30 into first recess 42, inserting second finger 34 into second recess 46, and inserting third finger 34 into third recess 44. Reticle 40 may then be handled by maneuvering handle 12. To release reticle 40, fingers 30, 32, 34 are moved away from each other, thereby removing fingers 30, 32, 34 from recesses 40, 42, 44, respectively. Thus, fingers 30, 32, 34 selectively extend into corresponding recesses 40, 42, 44.

Referring still to FIG. 1 and describing reticle capturing system 10 in more detail, handle 12 includes a first end 110 and an opposing second end 112. First end 110 may be attached to an automated system, such as a robotic system, or it may be used for manually handling reticle 40. Second end 112 is attached to a central portion 120 of bracket 14. A first end 122 of bracket 14 is attached to first arm 20, and an opposing second end 124 of bracket 14 is attached to second arm 22. Bracket 14 is preferably actuatable to move arms 20, 22 toward and away from each other. For example, bracket 14 may include a first hydraulic ram 126 between first end 122 and central portion 120 and a second hydraulic ram 128 between second end 124 and central portion 120 to lengthen or shorten bracket 14. Preferably, each hydraulic ram 126, 128 is opposed by a spring or other biasing member so that the default position of the reticle capturing system 10 is closed. Thus, if hydraulic rams 126, 128 fail, reticle capturing system 10 will not drop reticle 40. Any of several other configurations may be used to open and close reticle capturing system 10. For example, bracket 14 may include an actuatable pivot or it may be pivotally connected to handle 12 or arms 20, 22. It is also possible that fingers 30, 32, 34 may be actuatable relative to arms aims 20, 22 or that arms 20, 22 may include actuatable pivots to move fingers 30, 32, 34 toward or away from each other.

Referring to FIGS. 1–5, fingers 30, 32, 34 are preferably adapted to mate with recesses 42, 44, 46, respectively. In the embodiment shown in FIG. 1, the width of each finger 30, 32, 34 is greater than its height. Each finger 30, 32, 34 preferably includes opposing side surfaces 130, 132, 134 that are preferably semi-conical. Side surfaces 130, 132, 134 are joined by a bottom surface 140, 142, 144 and a top surface 150, 152, 154, respectively. Each top surface 150, 152, 154 preferably slopes downwardly and each bottom surface 140, 142, 144 preferably slopes upwardly until each top surface 150, 152, 154 meets a corresponding bottom surface 140, 142, 144 to form an edge 160, 162, 164, respectively. Accordingly, first finger 30 and third finger 32 taper inwardly in both the vertical and horizontal directions as they extend away from first arm 20, and second finger 34 tapers inwardly in both the vertical and horizontal directions as it extends away from second arm 22.

Referring still to FIGS. 1–5, reticle 40 includes a top main surface 170 and an opposing bottom main surface 172 that are preferably substantially parallel. Top main surface 170 and bottom main surface 172 are joined by a first edge 174 and an opposing second edge 176, and by a third edge 178 and an opposing fourth edge 180. First recess 42 and third recess 44 extend into reticle 40 from first edge 174, while second recess 46 extends inwardly from second edge 176 so that first recess 42 and third recess 44 are opposed to second recess 46. Reticle 40 includes a layer of material such as chrome or molysilicide on the top main surface 170 that includes a centrally located pattern etched therein (not shown). A border 190 of chrome or molysilicide extends about the periphery of top main surface 170 and does not include the etched pattern.

Recesses 42, 44, 46 are preferably adapted to mate with fingers 30, 32, 34, respectively. Accordingly, recesses 42, 44, 46 are preferably grooves that have the same shape as the corresponding fingers 30, 32, 34, except inverted. In the embodiment shown in FIGS. 1–5, the width of each recess 42, 44, 46 is greater than its height. Each recess 42, 44, 46 preferably includes opposing side surfaces 210, 212, 214 that are preferably semi-conical. Side surfaces 210, 212, 214 are joined by a bottom surface 220, 222, 224 and a top surface 230, 232, 234, respectively. Each top surface 230, 232, 234 preferably slopes downwardly and each bottom surface 220, 222, 224 preferably slopes upwardly as they extend into reticle 40 so that each recess 42, 44, 46 forms an edge 160, 162, 164 where the top surface 230, 232, 234 and the bottom surface 230, 232, 234, respectively, meet. Accordingly, first recess 42, second recess 44, and third recess 46 taper inwardly in both the vertical and horizontal directions as they extend into reticle 40. Preferably, the width and height of each recess 42, 44, 46 are substantially the same as the width and height of the corresponding finger 30, 32, 34. However, the recesses and fingers may be any of various shapes so long as they are adapted to mate with each other.

Pellicle frame 250 extends upwardly from the periphery of top main surface 170 and is secured thereto by an adhesive. Pellicle frame 250 supports a pellicle 260 thereon that extends between frame 250 and substantially covers top main surface 170 of reticle 40. Pellicle 260 is preferably above and substantially parallel to top main surface 170. Thus, pellicle 260 is not in the same focal plane as reticle 40 and contaminants on pellicle 260 will not significantly affect the function of reticle 40. It is also possible to have a pellicle beneath bottom main surface 172 of reticle 40. Pellicle frame 250 preferably includes at least a portion that is an gas permeable material such as a foam to obviate pressure differences between atmospheric pressure and the pressure between pellicle 260 and reticle 40.

Preferably, recesses 42, 44, 46 extend into reticle 40 far enough so that fingers 30, 32, 34 will be able to support reticle 40 when they extend into recesses 42, 44, 46. However, they should not extend into reticle 40 so far that they interfere with the operation of reticle 40. Preferably, recesses 42, 44, 46 do not extend into reticle 40 past pellicle frame 250 or reticle border 190 so that recesses 42, 44, 46 will not limit the effective area of reticle 40. In a preferred embodiment using a 9 inch reticle, recesses 42, 44, 46 extend to a depth of from about 2 mm to about 3 mm.

Handle 12, bracket 14, and arms 20, 22 are preferably all made from stainless steel or aluminum, and can be manufactured by methods well known to those skilled in the art. Materials other than stainless steel and aluminum can also be used, but the materials are preferably suitable for use in a clean room environment. However, the portions of fingers 30, 32, 34 that contact reticle 40 should be non-conductive. Accordingly, fingers 30, 32, 34 are preferably made from polyetheretherketone or floral polymer or they have a coating of such materials.

Reticles 40 are preferably made from quartz or sapphire. The process of manufacturing reticle 40 preferably includes slicing the basic shape of reticle 40 from an ingot of such material. Then recesses 42, 44, 46 are formed in reticle 40 by a milling tool. The milling tool should have a tapered end that is angled to form the proper angles for top surfaces 230, 232, 234, bottom surfaces 220, 222, 224, and side surfaces 210, 212, 214. The milling operation includes orienting the milling tool so that it is normal to an edge of reticle 40, contacting the edge and inserting the milling tool to a depth in reticle 40, dragging the milling tool along the edge of reticle 40 at a constant depth, and removing the milling tool from reticle 40. After the milling process, reticle 40 is preferably polished, and bottom main surface 172 or top main surface 170 is coated with a material such as chrome or molysilicide. A pattern is then etched in the chrome or molysilicide layer.

Pellicle 260 is secured to reticle 40 by pellicle frame 250 in a manner that is well known to those skilled in the art. Pellicle 260 and pellicle frame 250 may be made from materials that are known for use in pellicles and pellicle frames to those skilled in the art. For example, pellicle 260 may be made from cellulose acetate or floral polymer. It should be noted that the pellicle can be in various shapes and may cover only a portion of reticle 40 or it may cover almost the entire reticle 40.

Figure 6:
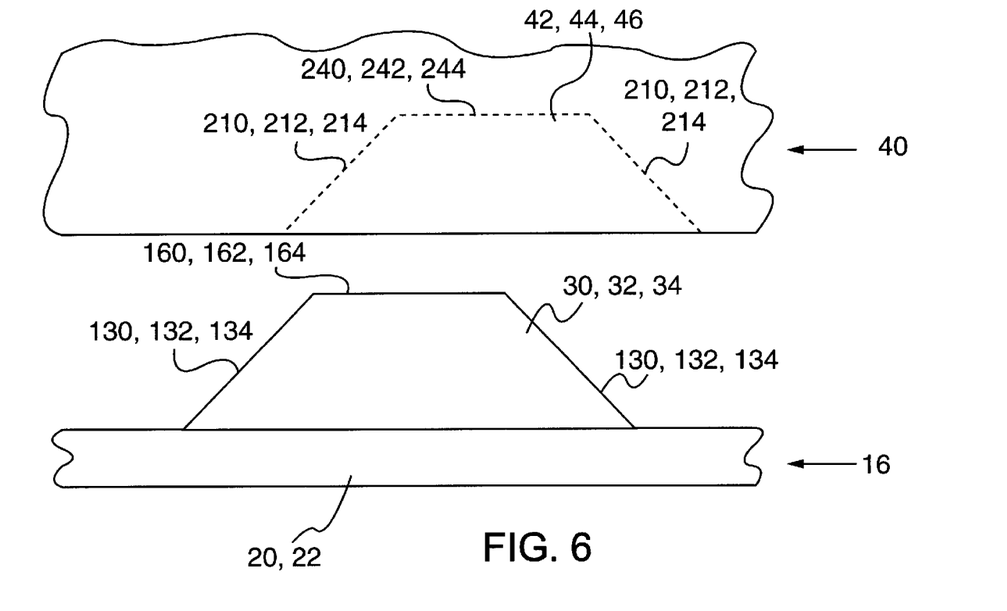
FIG. 6 is a top broken away view of a finger approaching a recess of a reticle according to the embodiment of FIG. 1.
Figure 7:
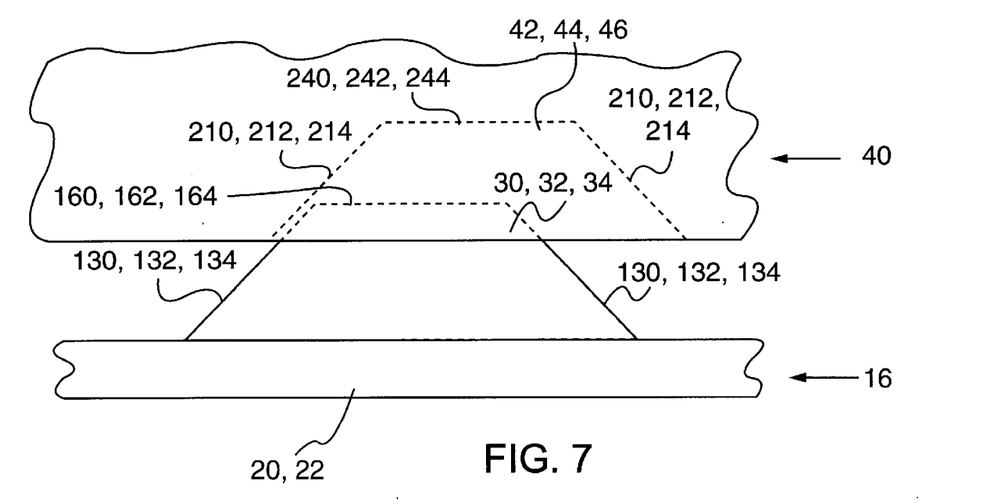
FIG. 7 is a top broken away view of a finger partially extending into a recess of a reticle according to the embodiment of FIG. 1.
Figure 8:
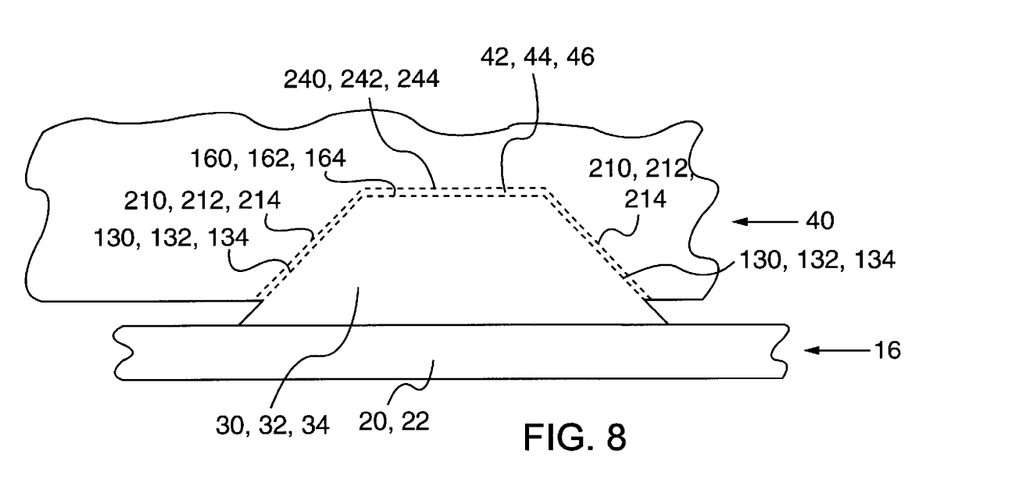
FIG. 8 is a top broken away view of a finger fully extending into a recess of a reticle according to the embodiment of FIG. 1.

In using reticle capturing system 10, fingers 30, 32, 34 are aligned with corresponding recesses 42, 44, 46 of reticle 40. Fingers 30, 32, 34 are then inserted into corresponding recesses 42, 44, 46 as shown in FIG. 1 so that first finger 30 and third finger 32 oppose second finger 34 and thereby secure reticle 40 within reticle capturing system 10. FIGS. 6–8 depict a finger 30, 32, 34 as it is inserted into a recess 42, 44, 46. Referring to FIG. 6, the finger 30, 32, 34 is substantially aligned with the corresponding recess 42, 44, 46, but it is somewhat off-center. Referring to FIG. 7, as the finger 30, 32, 34 extends partially into recess 42, 44, 46, a side surface 130, 132, 134 of the finger 30, 32, 34 contacts the corresponding side surface 210, 212, 214 of the recess 42, 44, 46. As the finger 30, 32, 34 extends farther into the recess 42, 44, 46, the side surface 130, 132, 134 of the finger 30 slides along the corresponding side surface 210, 212, 214 of the recess 42, 44, 46. Once the finger 30, 32, 34 extends completely into the recess 42, 44, 46 as shown in FIG. 8, the finger 30, 32, 34 is completely aligned with the corresponding recess 42, 44, 46. In this way, the tapered finger 30, 32, 34 and the tapered recess 42, 44, 46 force corresponding fingers 30, 32, 34 and recesses 42, 44, 46 to be self-centered, and reticle 40 is precisely located within reticle capturing system 10 when fingers 30, 32, 34 are extended completely into corresponding recesses 42, 44, 46. Because fingers 30, 32, 34 and recesses 42, 44, 46 are tapered vertically and horizontally, the self-centering function will occur in the vertical and horizontal directions. It should be appreciated that this self-centering function can be performed by several other tapered shapes within the scope of the present invention. Also, those skilled in the art will recognize that the self-centering function will occur even if only a portion of the fingers and/or the recesses are tapered.

After reticle 40 is captured by reticle capturing system 10, reticle 40 may be handled by maneuvering reticle capturing system 10 either manually or by automated mechanisms. Reticle 40 is released from reticle capturing system 10 by removing fingers 30, 32, 34 from recesses 42, 44, 46.

The embodiment described above provides many advantages. First, there is no need to touch the top main surface 170 or the bottom main surface 172 so there is virtually no risk of damaging the pattern formed on reticle 40, and reticle capturing system 10 may be used for virtually any type or shape of pellicle or pellicle frame. Second, the mating of recesses 42, 44, 46 with fingers 30, 32, 34 holds reticle 40 securely with little risk of it being dropped, even for heavy reticles such as 9 inch reticles. Third, because recesses 42, 44, 46 extend inwardly from the periphery of reticle 40 and do not extend beyond the pellicle frame, the area of the reticle that is transparent and can be effectively used is not diminished. Fourth, the tapered recesses 42, 44, 46 and tapered fingers 30, 32, 34 are self-centering so that fingers 30, 32, 34 need only be substantially aligned before extending into tapered recesses 42, 44, 46; once fingers 30, 32, 34 are fully extended into recesses 42, 44, 46 reticle 40 is precisely positioned within reticle capturing system 10. Reticle capturing system 10 is particularly useful for automated handling of reticles 40, but it also provides beneficial results if it is used as a manual reticle handler.

Figure 9:
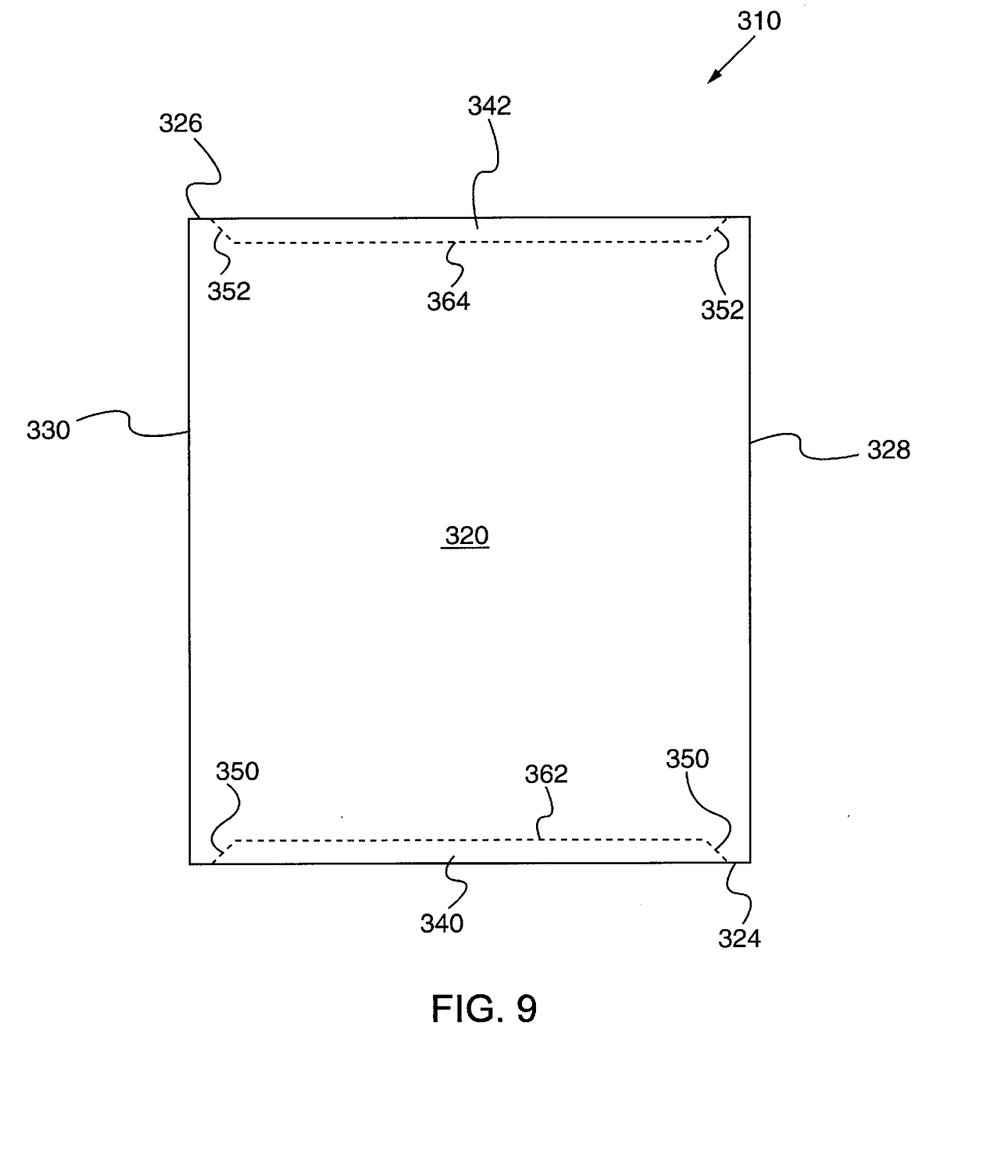
FIG 9 is a top plan view of a reticle according to an embodiment of the present invention.
Figure 10:
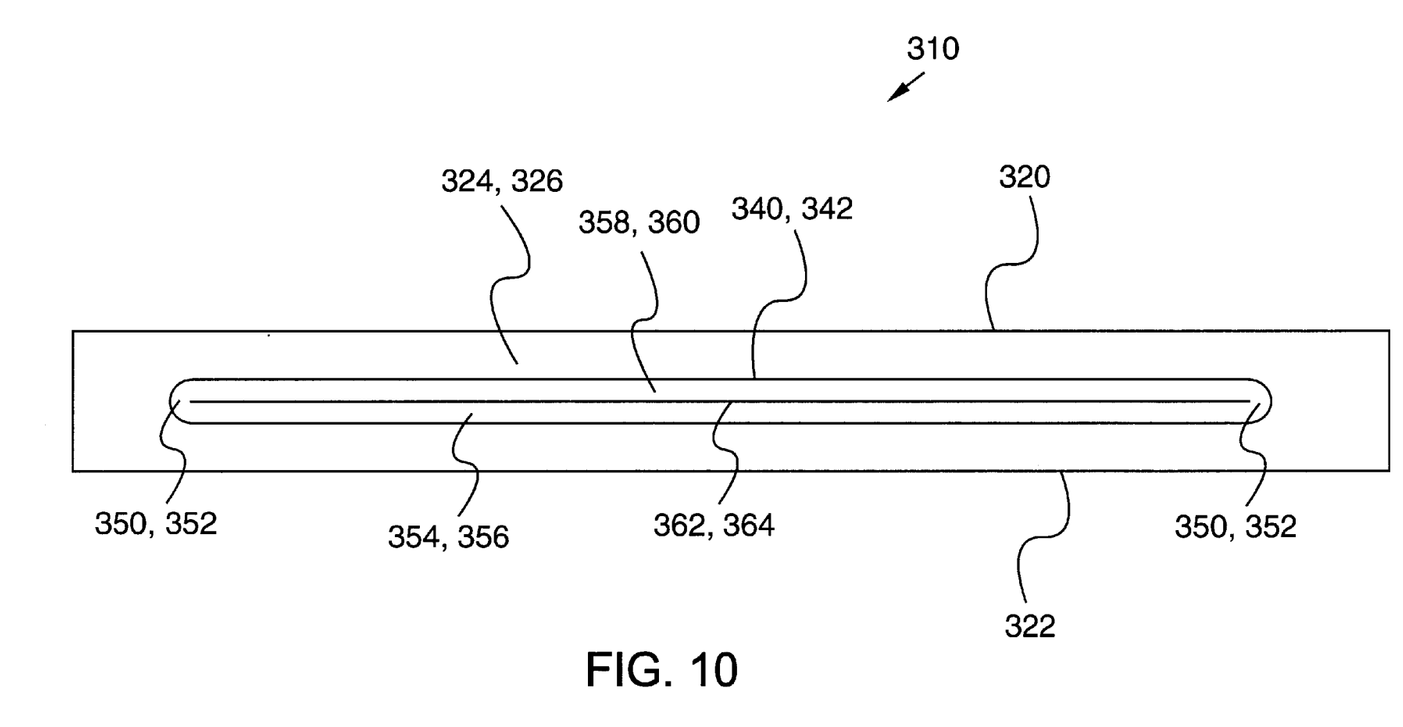
FIG. 10 is a side plan view of the reticle of FIG. 9.

FIGS. 9–15 depict various alternative embodiments of the present invention. Referring now to FIGS. 9 and 10, a reticle 310 includes a top main surface 320 and an opposing bottom main surface 322 that are preferably substantially parallel. Top main surface 320 and bottom main surface 322 are joined by a first edge 324 and an opposing second edge 326, and by a third edge 328 and an opposing fourth edge 330. A first recess 340 extends into reticle 310 from first edge 324, while a second recess 342 extends inwardly from second edge 326 so that first recess 340 is opposed to second recess 342.

Recesses 340, 342 are grooves that have the same shape as previously described recesses 42, 44, 46, except that recesses 340, 342 extend along substantially the entire length of first edge 324 and second edge 326, respectively. Each recess 340, 342 includes opposing side surfaces 350, 352 that are preferably semi-conical. Side surfaces 350, 352 are joined by a bottom surface 354, 356 and a top surface 358, 360, respectively. Each top surface 358, 360 preferably slopes downwardly and each bottom surface 354, 356 preferably slopes upwardly as they extend into reticle 310 so that each recess 340, 342 forms an edge 362, 364 where the top surface 358, 360 and the bottom surface 354, 356, respectively, meet. Accordingly, first recess 340 and second recess 342 taper inwardly in both the vertical and horizontal directions as they extend into reticle 310.

The same fingers 30, 32, 34 described above can be used to capture the reticle 310. Preferably if such fingers are used, first finger 30 and third finger 32 will be positioned so that they abut opposing side surfaces 350 of first recess 340. This may provide the horizontal self-centering function described above. This embodiment should be easier to manufacture than the embodiment described above, but it will likely be more difficult to self-center.

Figure 12:
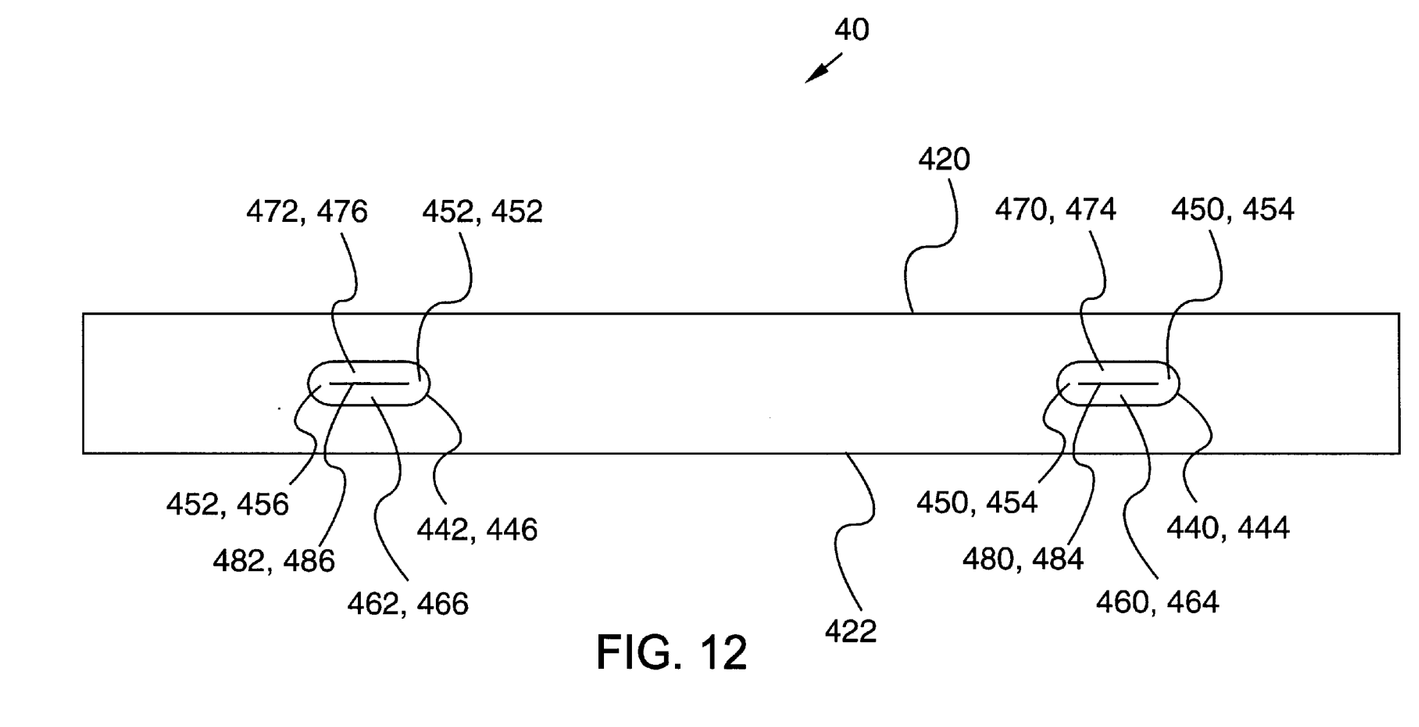
FIG 12 is a side plan view of the reticle of FIG. 11.

Referring now to FIGS. 10 and 12, a reticle 410 is depicted that is substantially the same as reticle 40. Reticle 410 includes a top main surface 420 and an opposing bottom main surface 422 that are preferably substantially parallel. Top main surface 420 and bottom main surface 422 are joined by a first edge 424 and an opposing second edge 426, and by a third edge 428 and an opposing fourth edge 430. A first recess 440 and a third recess 444 extend into reticle 410 from first edge 424, while a second recess 442 and a fourth recess 446 extend inwardly from second edge 426 so that first recess 440 and third recess 444 are opposed to second recess 442 and fourth recess 446.

Figure 11:
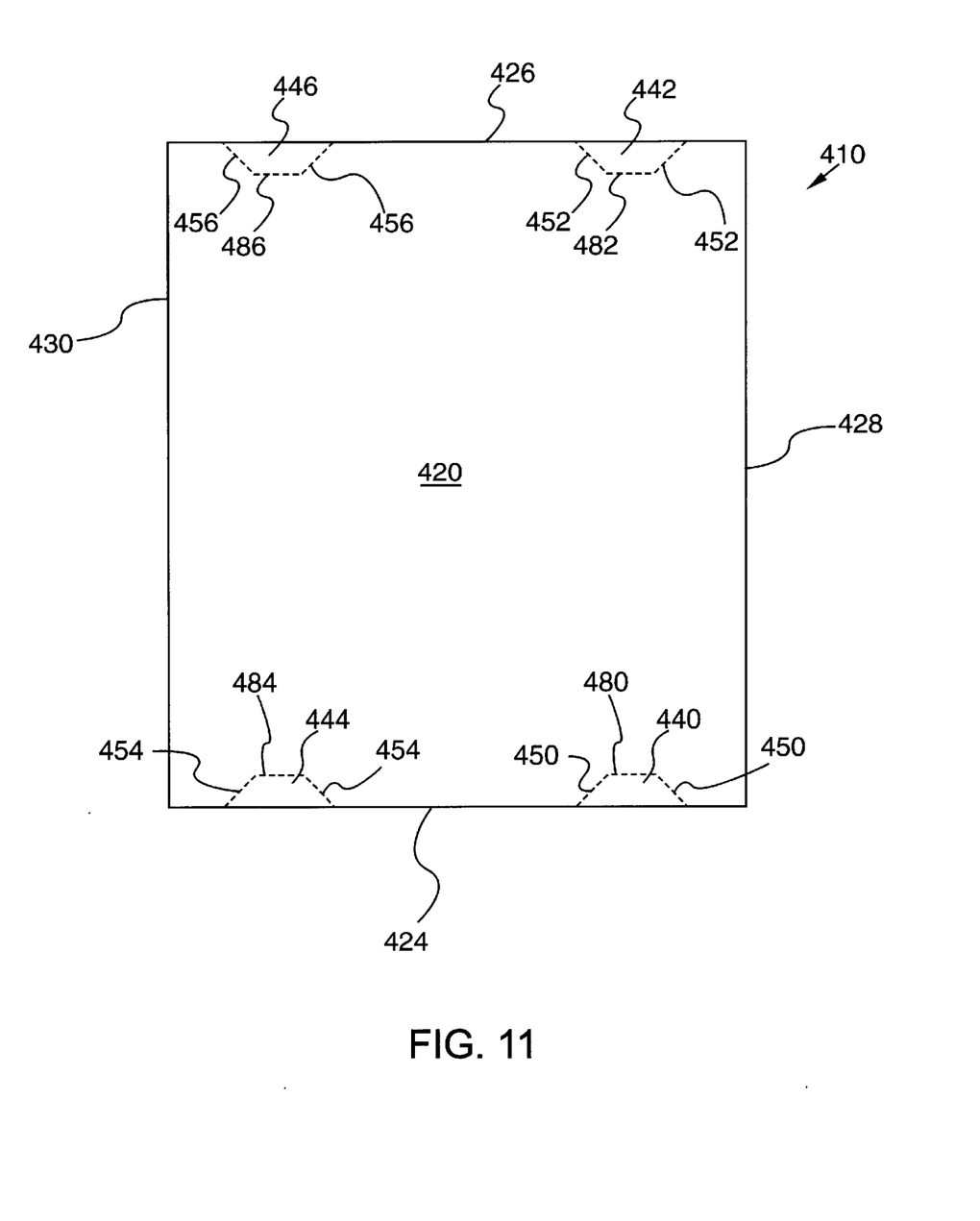
FIG. 11 is a top plan view of a reticle according to an embodiment of the present invention.

Recesses 440, 442, 444, 446 are grooves that have the same shape as previously described recesses 42, 44, 46, except that an additional recess 446 extends inwardly from second edge 426 of reticle 410. Each recess 440, 442, 444, 446 includes opposing side surfaces 450, 452, 454, 456 that are preferably semi-conical. Side surfaces 450, 452, 454, 456 are joined by a bottom surface 460, 462, 464, 466 and a top surface 470, 472, 474, 476, respectively. Each top surface 470, 472, 474, 476 preferably slopes downwardly and each bottom surface 460, 462, 464, 466 preferably slopes upwardly as they extend into reticle 410 so that each recess 440, 442, 444, 446 forms an edge 480, 482, 484, 486 where the top surface 470, 472, 474, 476 and the bottom surface 460, 462, 464, 466, respectively, meet. Accordingly, first recess 440, second recess 442, third recess 444, and fourth recess 446 taper inwardly in both the vertical and horizontal directions as they extend into reticle 410. The same fingers 30, 32, 34 described above can be used to capture the reticle 310, except that a fourth finger should be provided and second finger 34 must be offset.

Figure 13:
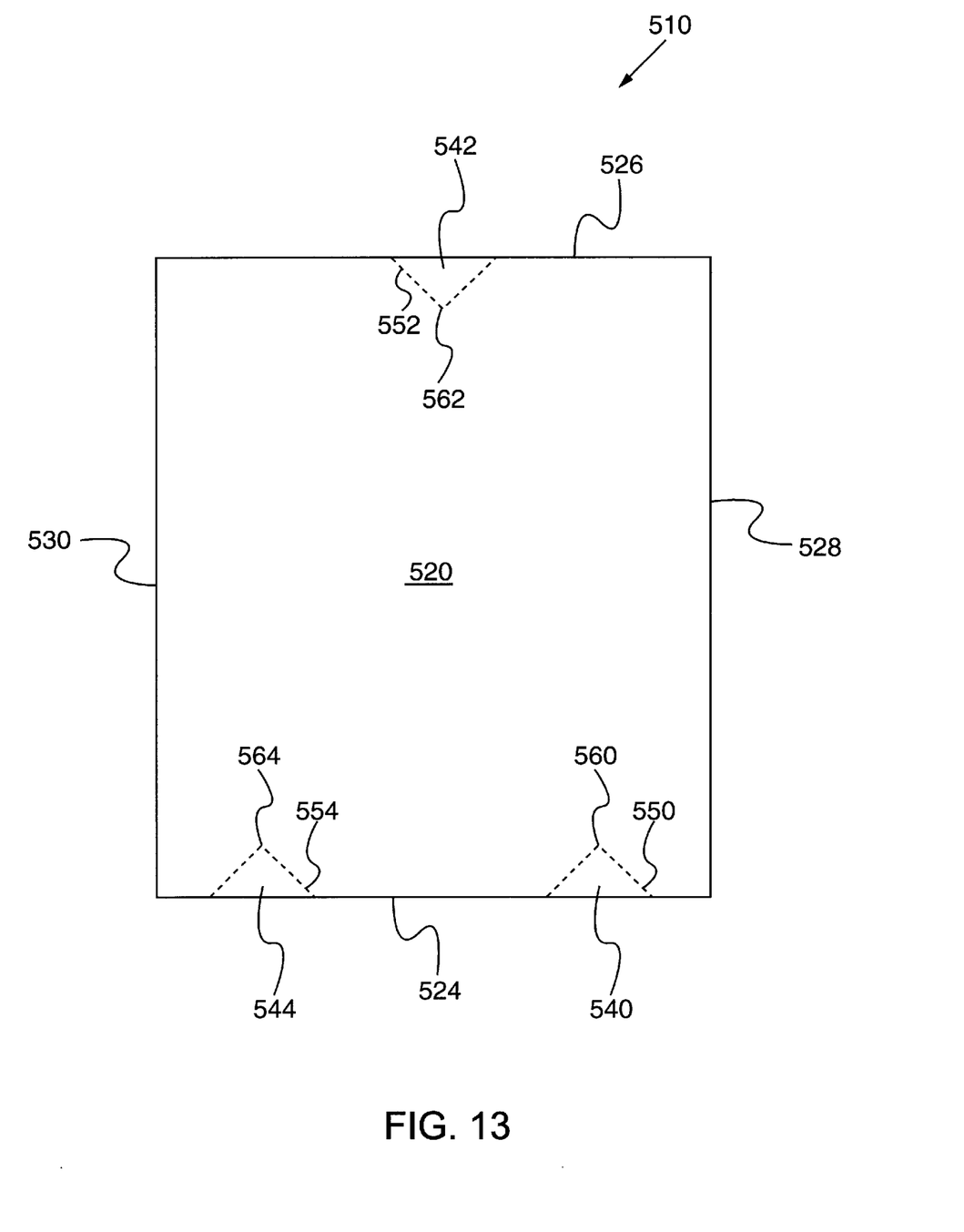
FIG. 13 is a top plan view of a reticle according to an embodiment of the present invention.
Figure 14:
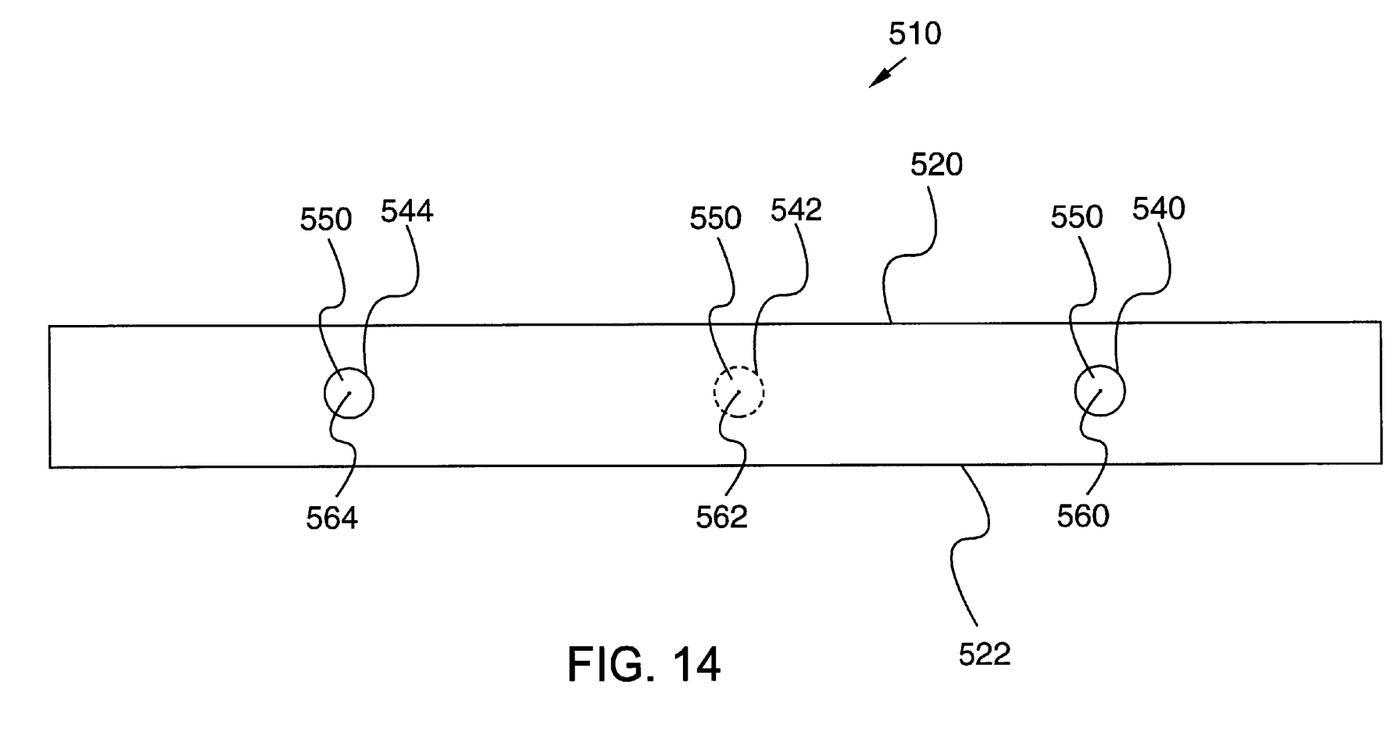
FIG. 14 is a side plan view of the reticle of FIG. 13.

Referring now to FIGS. 13 and 14, a reticle 510 is depicted that is substantially the same as reticle 40. Reticle 510 includes a top main surface 520 and an opposing bottom main surface 522 that are preferably substantially parallel.

Top main surface 520 and bottom main surface 522 are joined by a first edge 524 and an opposing second edge 526, and by a third edge 528 and an opposing fourth edge 530. A first recess 540 and a third recess 544 extend into reticle 510 from first edge 524, while a second recess 542 extends inwardly from second edge 526 so that first recess 540 and third recess 544 are opposed to second recess 542.

Figure 15:
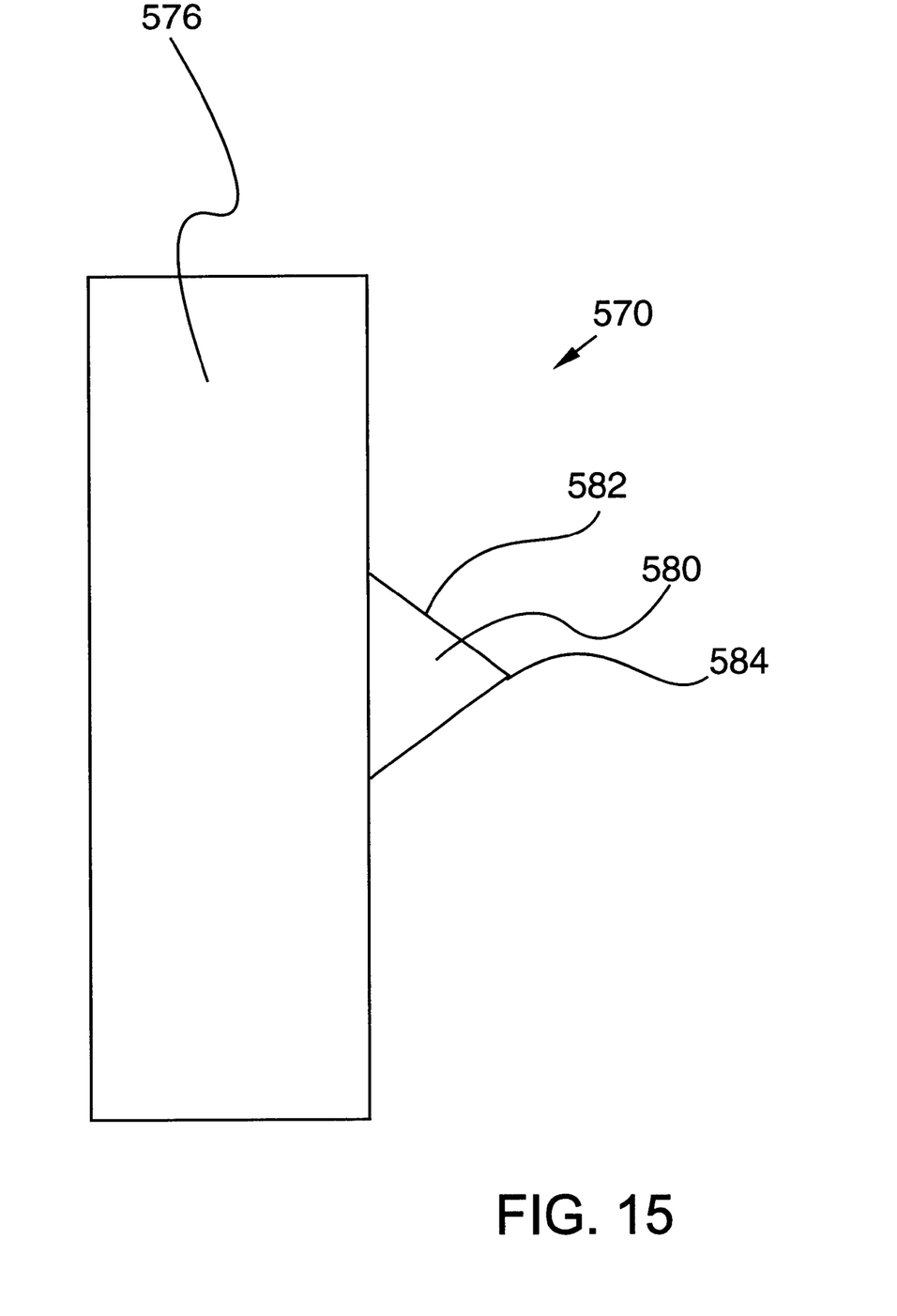
FIG. 15 is a front or rear plan view of an arm and finger for capturing the reticle of FIG. 13.

Recesses 540, 542, 544 are conical holes having circular cross sections, rather than being grooves as described above. Each recess 540, 542, 544 includes a conically tapering side surface 550, 552, 554 that terminates at a point 560, 562, 564, respectively. Accordingly, first recess 540, second recess 542, and third recess 544 taper inwardly in both the vertical and horizontal directions as they extend into reticle 510. End effector or pick 570 depicted in FIG. 15 includes arms 576 and at least one finger 580 extending from each arm 576. Fingers 580 each include a conically tapering side surface 582 that terminates at a point 584 so that they can effectively mate with corresponding recesses 540, 542, 544. Otherwise, the system of FIGS. 13-15 is similar to reticle capturing system 10 described above.

While the invention has been particularly shown and described with reference to preferred embodiments thereof, it will be understood by those skilled in the art that various changes in form and details may be made therein without departing from the spirit and scope of the invention. For example, many other configurations and shapes of the fingers and recesses, such as hemispherical or parallelopiped shaped fingers and recesses, may be used in accordance with the present invention. Unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A reticle comprising:
   a substrate having a first main surface opposite a second main surface, wherein at least one of the first main and second main surfaces is a pattern forming surface and wherein the first main and second main surfaces are separated by a thickness having at least one peripheral edge; and
   at least one recess defined by the substrate and configured to receive at least one finger, the at least one recess extending into the substrate from the at least one peripheral edge.

2. The reticle of claim 1, wherein the at least one peripheral edge comprises a first edge and an opposing second edge, wherein the at least one recess comprises a first recess defined by the substrate and a second recess defined by the substrate, and wherein the first recess extends from the first edge and the second recess extends from the second edge.

3. The reticle of claim 2, wherein the at least one recess further comprises a third recess that extends from the first edge.

4. The reticle of claim 1, wherein the at least one recess is a tapered groove that extends along the at least one peripheral edge.

5. The reticle of claim 1, wherein the at least one recess is tapered and wherein the at least one recess has a substantially circular cross section.

6. A reticle capturing system comprising:
   a reticle;
   a first recess defined by the reticle, the first recess extending into the reticle from a first edge of the reticle;
   a second recess defined by the reticle, the second recess extending into the reticle from a second edge of the reticle, wherein the second edge opposes the first edge;
   a first finger selectively extending into the first recess; and
   a second finger selectively extending into the second recess.

7. The reticle capturing system of claim 6, wherein the first finger is tapered and wherein the second finger is tapered.

8. The reticle capturing system of claim 6 further comprising:
   a third recess defined by the reticle, the third recess extending into the reticle from the first edge of the reticle; and
   a third finger selectively extending into the third recess.

9. The reticle capturing system of claim 8, wherein the first recess is a groove having a first groove width, the second recess is a groove having a second groove width, and the third recess is a groove having a third groove width.

10. The reticle capturing system of claim 9, wherein the first finger has a first finger width that is substantially the same as the first groove width, the second finger has a second finger width that is substantially the same as the second groove width, and the third finger has a third finger width that is substantially the same as the third groove width.

11. The reticle capturing system of claim 10, wherein the first finger, the second finger, and the third finger are tapered and wherein the first groove, the second groove, and the third groove are tapered.

12. The reticle capturing system of claim 6, further including a third finger selectively extending into the first recess.

13. The reticle capturing system of claim 6, wherein the first finger is conically tapered and the first recess is conically tapered.

14. The reticle capturing system of claim 9, wherein the first finger is conical, and wherein the first recess is conical.

15. A method for capturing a reticle comprising the steps of:
   providing a reticle that defines at least one recess extending into the reticle from at least one edge of the reticle wherein the at least one edge comprises a first edge and an opposing second edge, wherein the at least one recess comprises a first recess extending from the first edge, a second recess extending from a second edge, and a third recess extending from the first edge; and
   inserting at least one finger into the at least one recess, and wherein the step of inserting at least one finger comprises inserting a first finger into the first recess, inserting a second finger into the second recess, and inserting a third finger into the third recess.

16. A method for capturing a reticle comprising the steps of:
   providing a reticle that defines at least one recess extending into the reticle from at least one edge of the reticle; and
   inserting at least one finger into the at least one recess wherein the at least one finger is tapered.

17. The method of claim 16, wherein the at least one finger is conically tapered and wherein the at least one recess is conically tapered.

18. The method of claim 16, wherein the at least one recess comprises at least one tapered groove having a groove width, and wherein the at least one finger comprises a tapered finger having a finger width that is substantially the same as the groove width.

* * * * *